(12) United States Patent
Hu et al.

(10) Patent No.: US 7,884,461 B2
(45) Date of Patent: Feb. 8, 2011

(54) SYSTEM-IN-PACKAGE AND MANUFACTURING METHOD OF THE SAME

(75) Inventors: Dyi-Chung Hu, Chutung Township, Hsinchu County (TW); Chun-Hui Yu, Tainan (TW)

(73) Assignee: Advanced Clip Engineering Technology Inc., Hukou Township, Hsinchu County 303 (TW)

( * ) Notice: Subject to any disclaimer, the term of this patent is extended or adjusted under 35 U.S.C. 154(b) by 233 days.

(21) Appl. No.: 12/217,086

(22) Filed: Jun. 30, 2008

(65) Prior Publication Data

US 2009/0321915 A1    Dec. 31, 2009

(51) Int. Cl.
*H01L 23/48* (2006.01)

(52) U.S. Cl. .......... 257/690; 257/698; 257/700; 257/789; 257/E23.116; 257/E21.5

(58) Field of Classification Search .......... 257/690, 257/698, 734, 735, 773, 781–784, 788, 789, 257/E23.01, E21.5
See application file for complete search history.

(56) References Cited

U.S. PATENT DOCUMENTS

| | | | |
|---|---|---|---|
| 6,362,087 B1 * | 3/2002 | Wang et al. | 438/597 |
| 6,506,632 B1 | 1/2003 | Cheng et al. | |
| 6,825,553 B2 * | 11/2004 | Chua et al. | 257/691 |
| 2006/0001145 A1 * | 1/2006 | Ho et al. | 257/690 |
| 2007/0262436 A1 * | 11/2007 | Kweon et al. | 257/686 |
| 2008/0006936 A1 | 1/2008 | Hsu | |
| 2008/0164599 A1 * | 7/2008 | Brunnbauer et al. | 257/690 |
| 2009/0102002 A1 * | 4/2009 | Chia et al. | 257/433 |
| 2009/0157398 A1 * | 6/2009 | Kim et al. | 704/226 |

\* cited by examiner

*Primary Examiner*—Jasmine J Clark
(74) *Attorney, Agent, or Firm*—Abelman, Frayne & Schwab

(57) ABSTRACT

The present invention discloses a structure of package comprising: a substrate with a die receiving through hole and a contact conductive via formed therein, a die disposed within the die receiving through hole, a surrounding material filled in the gap except the die area of the die receiving though hole, a re-distribution layer formed on the substrate and coupled to the contact conductive via, a protection layer formed over the re-distribution layer, a cover material formed over the protection layer; and a terminal contact pad formed on the lower surface of the substrate and under the contact conductive via and the die to couple the contact conductive via.

10 Claims, 2 Drawing Sheets

SYSTEM-IN-PACKAGE AND MANUFACTURING METHOD OF THE SAME

FIELD OF THE INVENTION

This invention relates to a semiconductor package structure, and more particularly to a manufacturing method of a System-in-Package (SIP) with a planarized substrate to improve the reliability, yield and to reduce the thickness of the package.

DESCRIPTION OF THE PRIOR ART

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As a semiconductor become more complicated, the traditional package technique, for example lead frame package, flex package, rigid package technique, can't meet the demand of producing smaller chip with high density elements on the chip.

Furthermore, because conventional package technologies have to divide a dice on a wafer into respective dice and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip ball grid array (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dice). Generally, after completion of all assembling processes or packaging processes, individual semiconductor packages are separated from a wafer having a plurality of semiconductor dice. The wafer level package has extremely small dimensions combined with extremely good electrical properties.

WLP technique is an advanced packaging technology, by which the die are manufactured and tested on the wafer, and then the wafer is singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

A method of forming IC package having downward-facing chip cavity disclosed by U.S. Pat. No. 6,506,632 suffers the planarity issue. In the prior art, it merely performs a step of the metallic layer planarized, for example, by conducting a chemical-mechanical polishing operation to form a metallic layer. Another prior art, superfine-circuit semiconductor package structure disclosed by Patent Publication Number US 20080006936 still suffers the planarity issue. In this prior art, with a process of polishing or etching, a portion of the metal conductor structure and a portion of the conductive layer are removed from the second insulating layer. Both of the prior arts, the substrate with through hole used as embedded substrate will suffer poor yield due to lack of planarity. Further, it will cause photolithograph problems in the subsequent processing.

Further, some technical involves the usage of die that directly formed on the upper surface of the substrate. As known, the pads of the semiconductor die will be redistributed through redistribution processes involving a redistribution layer (RDL) into a plurality of metal pads in an area array type. The build up layer will increase the size of the package. Therefore, the thickness of the package is increased. This may conflict with the demand of reducing the size of a chip.

Further, the prior art suffers complicated process to form the "Panel" type package. It needs the mold tool for encapsulation and the injection of mold material. It is unlikely to control the surface of die and compound at same level due to warp after heat curing the compound, the CMP process may be needed to polish the uneven surface. The cost is therefore increased.

Therefore, the present invention provides a new embedded SIP manufacturing methods and structure with good yield and shrinkage size to overcome the aforementioned problem.

SUMMARY OF THE INVENTION

The object of the present invention is to provide a manufacturing method of a System-in-Package (SIP) with a planarized substrate to improve the reliability, yield and to reduce the total thickness of the package.

Another object of the present invention is to provide a manufacturing method of a System-in-Package (SIP) which can use photolithography process without consideration of modification of process parameters to solve difficulties caused by the surface topology.

The present invention discloses a structure of package comprising: a substrate with a die receiving through hole and a contact conductive via formed therein, a die disposed within the die receiving through hole, a surrounding material filled in the gap except the die area of the die receiving though hole, a re-distribution layer formed on the substrate and coupled to the contact conductive via, a protection layer formed over the re-distribution layer, a cover material formed over the protection layer; and a terminal contact pad formed on the lower surface of the substrate and under the contact conductive via and the die to couple the contact conductive via.

The material of the substrate includes epoxy type FR5, FR4, BT, silicon, PCB (print circuit board) material, glass or ceramic. Alternatively, the material of the substrate includes alloy or metal; it prefers that the CTE (Coefficient of Thermal Expansion) of the substrate is close to the CTE of mother board (PCB) having CTE around 16 to 20. The adhesive material includes an elastic dielectric material, a photosensitive material, a silicone dielectric based material, siloxane polymer, polyimides (PI) or silicone resin.

Another aspect of the present invention is disclosed a method for forming semiconductor device package comprising: providing a substrate with die receiving through holes and a contact conductive via formed therein; placing dice into the die receiver through holes of the substrate by a pick and place fine alignment system; forming an adhesive material on the back side of the substrate and filling into the gap between the dice and the die receiver through hole; forming a redistribution layer on the upper surface of the substrate and coupled to the contact conductive via; forming a protection layer over the re-distribution layer; forming a cover material over the protection layer; grinding the adhesive material and the back side of the substrate until exposing the back side of the die; forming a terminal contact pad on the lower surface of the substrate and under the die to couple said contact conductive via; and cutting the substrate from the lower surface of the substrate passing through the cover material.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims.

The present invention discloses a structure of System-in-Package (SIP) and manufacturing method thereof which utilizing a planarized substrate as starting substrate by grinding the back side of the substrate and die to expose back side of the die and form a super thin structure. Connectors are disposed at the back side of the die and substrate, for example under bump metallurgy (UBM), which connects the solder joint and the chip, is formed onto the back side of the die and/or under the substrate.

Figure 1:
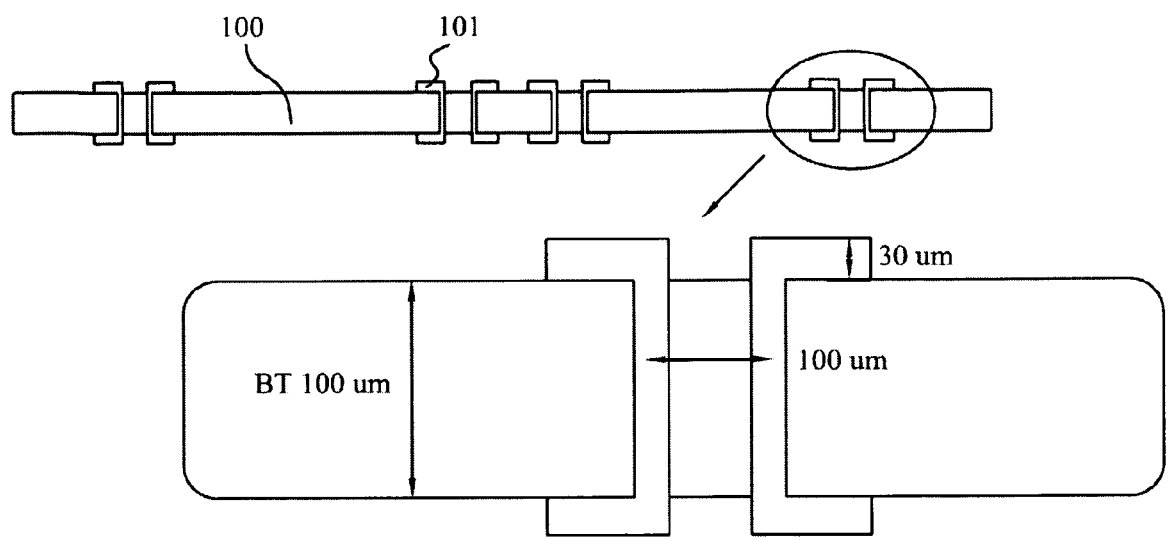
FIG. 1 illustrates a cross-sectional view of a structure of a substrate with a metallic via.

FIG. 1 illustrates a cross-sectional view of structure of a substrate with a metallic layer. As shown in the FIG. 1, the structure of the substrate 100 having a contact conductive (metal) via 101 formed therein for electrical connecting. The contact metal via 101 is formed over the upper surface of the substrate 100 through the substrate to the lower surface. For example, the contact metal via 101 formed on the upper and/or lower surface of the substrate 100 has height about 30 microns, and width between adjacent contact metal via 101 is about 100 microns.

In one embodiment, the material of the substrate 100 includes epoxy type FR5, FR4, BT (Bismaleimide triazine), silicon, PCB (print circuit board) material, glass or ceramic. Alternatively, the material of the substrate 100 includes alloy or metal; it prefers that the CTE (Coefficient of Thermal Expansion) of the substrate is close to the CTE of mother board (PCB) having CTE around 16 to 20.

Figure 2:
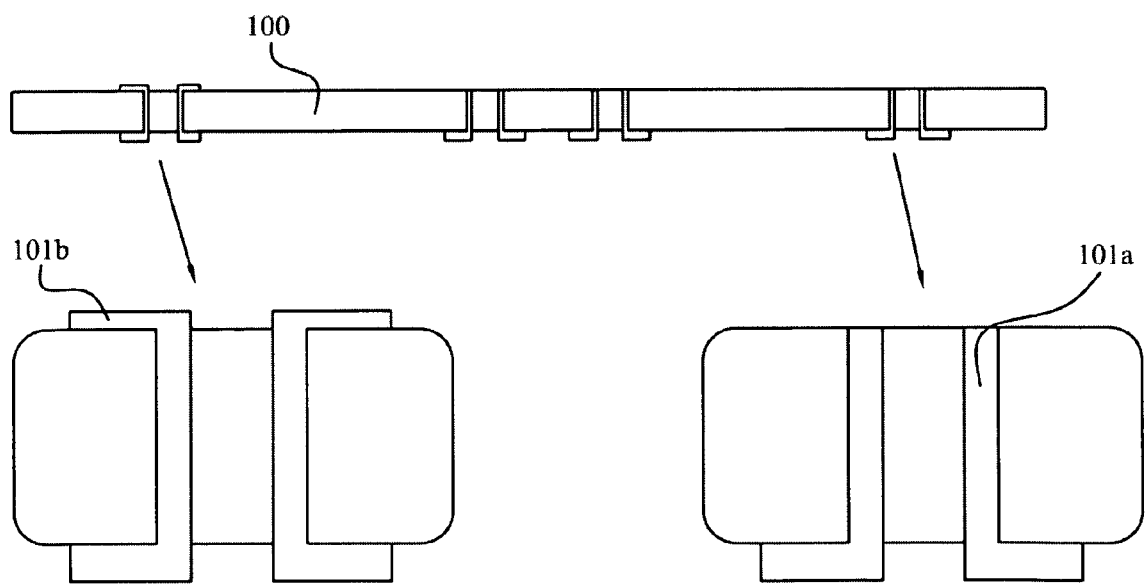
FIG. 2 illustrates a cross-sectional view of a structure of a substrate with a flat surface metallic via according to the present invention.

FIG. 2 illustrates a cross-sectional view of a structure of a substrate with a flat surface metallic via according to the present invention. The contact metal via 101a has the same level upper surface with the substrate 100, and contact metal via 101b has reduced metal height than that of the contact metal via 101 of the FIG. 1. In other words, the contact metal layer on its upper surface of the substrate 100 is removed to form the contact metal via 101a such that the substrate has a flat surface, or the contact metal layer on its upper surface of the substrate 100 may be partially removed to form the contact metal via 101b such that the substrate has a thinner metallic layer on its upper surface. In the contact metal via 101b case, it reduces the metal height, and in the contact metal via 101a case, it removes all surface metal.

Figure 3:
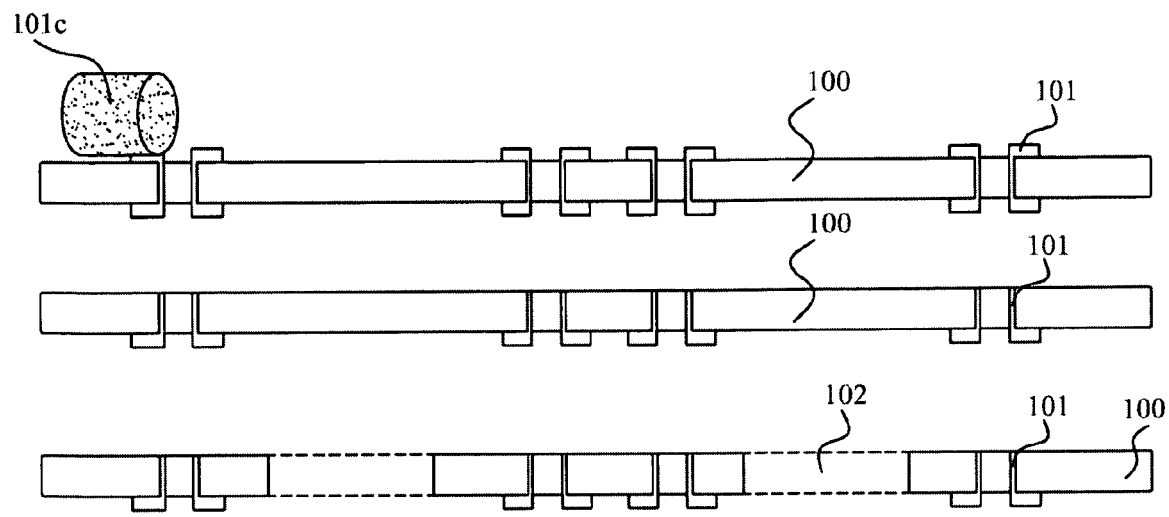
FIG. 3 illustrates a cross-sectional view of forming the die receiving through hole substrate according to the present invention.

FIG. 3 illustrates a cross-sectional view of forming the die receiving through hole substrate according to the present invention. First, a substrate 100 is provided with pre-formed contact conductive (metal) via 101 which is formed from the upper surface of the substrate 100 and filling into via hole to the lower surface of the substrate 100. The pre-formed contact conductive (metal) via 101 may be formed by photolithographic and etching process. Patterned metallic layer of the contact conductive (metal) via 101 located upper surface of the substrate 100 is then ground by a grinding device (wheel) until exposing the substrate. Alternatively, an etching process may be executed to remove contact conductive (metal) via 101 on the upper surface of the substrate 100. In other words, all surface metal located at upper surface of the substrate is removed. Next, the substrate 100 is punched or drilled to form die receiving through holes 102. The through holes 102 pass through the substrate 100. Therefore, the substrate 100 is provided with die receiving through holes and a contact conductive via is formed therein.

Figure 4:
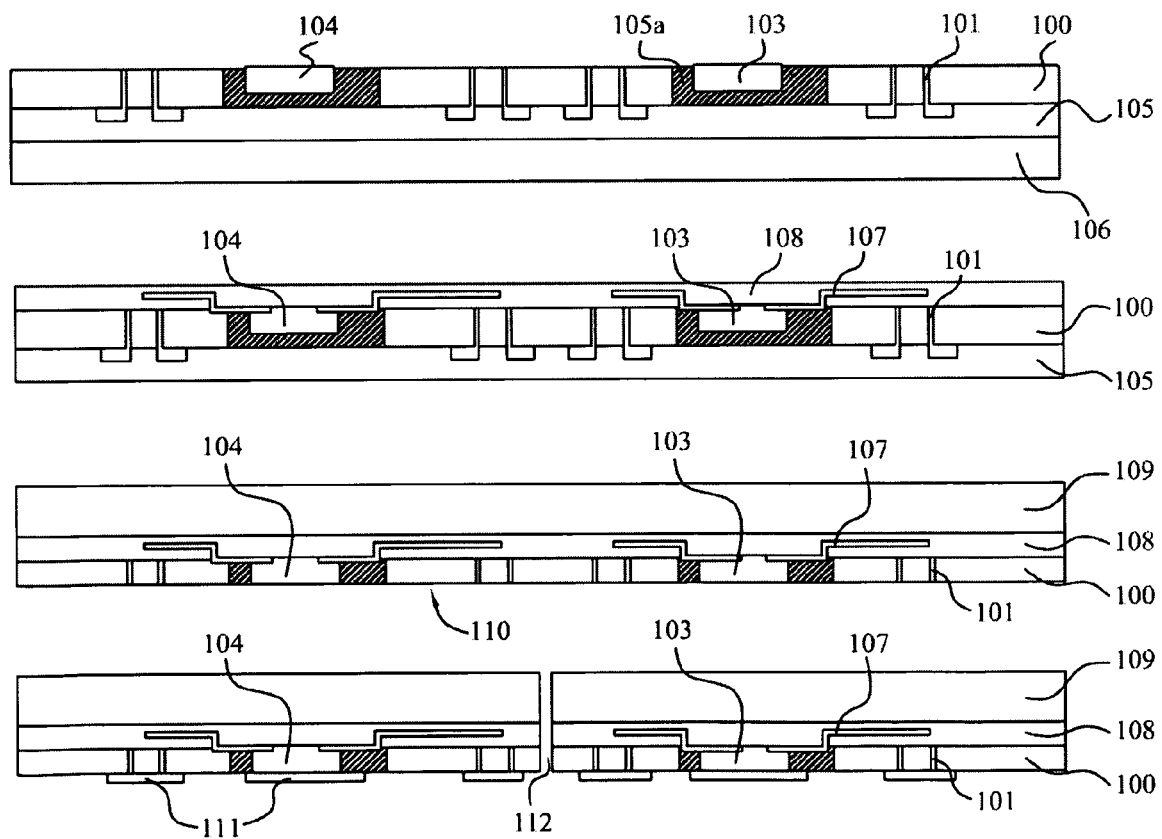
FIG. 4 illustrates a cross-sectional view of the dice packaging process according to the present invention.

FIG. 4 illustrates a cross-sectional view of the dice packaging process according to the present invention. Subsequently, dice 103 and 104 are placed into the die receiver through holes 102 of the substrate 100 on another substrate by a pick and place fine alignment system. An adhesive material 105, 105a is forming on the back side of the substrate 100 and filling into the gap between the dice 103, 104 and the die receiver through holes 102. A re-distribution layer 107 is formed on the upper surface of the substrate 100 and coupled to the contact conductive via 101 on a carrier 106. The substrate 100 is disposed on the carrier 106 through the adhesive material 105. In general, the height of the substrate 100 is higher than that of the dice 103 and 104. As know, contact pads (Bonding pads) are formed on the dice 103 and 104.

As shown in FIG. 4, the adhesion materials 105 is for example a temporary adhesion material. In one case, the carrier 106 could be made of polymer or metal (C7025 or Alloy42) with the shape of panel form. The upper portion of FIG. 4 illustrates the combination of the carrier and the panel wafer (substrate). The panel wafer will be adhered with the carrier, and it will stick and hold the panel wafer during process.

The RDL (redistribution layer) 107, also referred to as conductive trace, is formed on the substrate 100 by photolithography and etching process, wherein the redistribution layer 107 keeps electrically connected with the dice 103, 104 through I/O pads and/or the terminal contact conductive pads, and connected with the contact conductive via 101. A protection layer 108 is employed to cover the redistribution layer 107.

In one embodiment of the invention, the material of the redistribution layer 107 comprises Ti/Cu/Au alloy or Ti/Cu/Ni/Au alloy; the thickness of the RDL is between 2 um_and__ 15 um. The Ti/Cu alloy is formed by sputtering technique also as seed metal layers, and the Cu/Au or Cu/Ni/Au alloy is formed by electroplating; exploiting the electro-plating process to form the RDL can make the RDL thick enough and better mechanical properties to withstand CTE mismatching during temperature cycling. The metal pads can be Al or Cu or combination thereof.

In one embodiment of the present invention, the protection layer 108 may be made by dielectric material which comprises preferably an elastic dielectric material, for example silicone dielectric based materials comprising siloxane polymers, Dow Corning WL5000 series, and the combination thereof. In another embodiment, the protection layer 108 is made by a material comprising, polyimides (PI), BCB or silicone resin.

In one embodiment of the present invention, the elastic dielectric layer 108 is a kind of material with CTE larger than 100 (ppm/° C.), elongation rate about 40 percent (preferably 30 percent-50 percent), and the hardness of the material is between plastic and rubber. The thickness of the elastic dielectric layer 108 depends on the stress accumulated in the RDL/dielectric layer interface during temperature cycling test.

A cover material 109 is formed on the protection layer 108. The cover material 109 may be made by polymer or metal sheet to further protect the package. The adhesive material 105 is then removed by an etching process. Next, the substrate 100 is polished by grinding or lapping the back side of the substrate 100 and dice in sequence to expose back side of the die and form a super thin package structure. Alternatively, the adhesive material 105 and the substrate 100 can be polished by grinding or lapping the adhesive material and the back side of the substrate 100 until exposing the back side of the dice such that the package height is far less than that of the conventional package. In other words, lower surface of the substrate 100 is open. The height of the substrate 100 will be reduced, and it removes all surface metal located at lower surface of the substrate. Patterned metallic layer of the contact conductive (metal) via 101 located lower surface of the substrate 100 is then removed. In one embodiment, laser process may be employed to expose the back side of the dice and the contact conductive via 101. It should be noted that the back side of the dice 103, 104 and the back side 110 of the substrate 100 may have almost the same level.

Finally, a terminal contact pad, also referred to as under bump metallurgy (UBM), 111 is located at the lower surface of the substrate 100 and under the contact metal via 101 and connected to the contact conductive pads of the substrate 100 through the contact metal via 101 and the redistribution layer 107. A scribe line 112 is defined between the package units for separating each unit, optionally, there is no dielectric layer over the scribe line for better cutting quality.

The terminal pads may act as the UBM (under ball metal) under the BGA scheme. Pluralities of contact conductive pads are formed on the upper surface of the substrate 100 and under the redistribution layer 107.

The substrate could be round type such as wafer type, the diameter could be 200, 300 mm or higher. It could be employed for rectangular type such as panel form. The substrate 100 may be pre-formed with die receiving through holes. Please refer to FIG. 3, it shows that the substrate 100 includes a plurality of pre-formed die receiving through holes 102.

To sum up, the present invention includes provides a structure of semiconductor device package, shown in lower portion of the FIG. 4, which comprises a substrate 100 with a die receiving through hole and a contact conductive via 101 formed therein. A die 103 or 104 disposes within the die receiving through hole. Adhesive material 105a fills in the area (gap) except the die area of the die receiving though hole and surrounds the die. A re-distribution layer 107 is located on the substrate 100 and coupled to the contact conductive via 101. A protection layer 108 is formed over the re-distribution layer. A cover material 109 is formed over the protection layer 108. A terminal contact pad 111, under bump metallurgy (UBM), is formed on the lower surface of the substrate 100 and under the contact conductive via 101 and the 103 or 104 to couple the contact conductive via 101. Conductive bumps may be coupled to the terminal contact pad 111. Structure of semiconductor device package of the present invention has a good planarization surface due to planarized substrate for terminal contact pad 111 facilitating connecting to an external print circuit board. Connectors (terminal contact pads) are disposed at the back side of the die and lower planarized surface of the substrate. In the package structure, the die 103 or 104 and the substrate 100 have almost the same level such that the package structure has a smaller package size.

Thereafter, process for the present invention includes providing a substrate with die receiving through holes and a contact conductive via formed therein. Then, a pick and place fine alignment system with flip chip function is used to redistribute the desired dice on the substrate with desired pitch. An adhesive material is formed on the back side of the substrate and filling into the gap between the dice and the die receiver through hole. Subsequently, a re-distribution layer is formed on the upper surface of the substrate and coupled to the contact conductive via. Next, a protection layer is formed over the re-distribution layer. A cover material is formed over the protection layer. Then, the adhesive material and the back side of the substrate are grinding in sequence until exposing the back side of the die. A terminal contact pad is formed on the lower surface of the substrate and under the die to couple the contact conductive via. Finally, the substrate is cut from the lower surface of the substrate passing through the cover material to separate individual unit. The process of the present invention is shown in FIG. 3 and FIG. 4, and detailed description refers to the above-mentioned.

Hence, according to the present invention, the aforementioned package structure has the advantages list as follow: the process of manufacturing of the SIP package structure of the present invention is significantly simple.

The advantages of the present inventions are:

The process is simple for forming panel wafer type and is easy to control the roughness of panel wafer surface. The thickness of panel wafer (substrate) is reduced. The panel wafer is easy to be processed by wafer level packaging process. Manufacturing method of a System-in-Package (SIP) with a planarized substrate can improve the reliability, yield and to reduce the total thickness of the package. System-in-Package (SIP) may be formed by using photolithography process without consideration of modification of process parameters to solve difficulties caused by the surface topology.

The substrate is pre-prepared with pre-form die receiving through holes and contact conductive via; the size of package is far smaller than that of the conventional package. The packaging throughput will be increased (manufacturing cycle time was reduced) due to simple manufacturing method. The terminal pads are formed on the opposite side of the dice active surface and lower surface of the substrate. Structure of semiconductor device package has a good planarization surface for terminal contact pad facilitating connecting to an external print circuit board. It can avoid PCB mother board with uneven surface electrical connecting failure due to protrusion contact metal layer.

The die and substrate be bonded together with carrier. The reliability for both package and board level is better than ever, especially, for the board level temperature cycling test, it was due to the CTE of substrate and PCB mother board are identical, hence, no thermal mechanical stress be applied on the solder bumps/balls; the previous failure mode (solder ball crack) during temperature cycling on board test were not obvious. The cost is low and the process is simple. It is easy to form the multi-chips package as well.

Although preferred embodiments of the present invention have been described, it will be understood by those skilled in the art that the present invention should not be limited to the described preferred embodiments. Rather, various changes and modifications can be made within the spirit and scope of the present invention, as defined by the following claims.

What is claimed is:

1. A structure of semiconductor device package comprising:
   a substrate with a die receiving through-hole and a contact conductive via formed therein;
   a die disposed within said die receiving through-hole, wherein a space is provided within said die receiving through-hole;
   a surrounding material filled into said space within said die receiving though-hole;
   a re-distribution layer formed on said substrate and coupled to said contact conductive via;
   a protection layer formed over said re-distribution layer;
   a cover material formed over said protection layer; and
   a terminal contact pad formed on a lower surface of said substrate and under said contact conductive via and said die to couple said contact conductive via.

2. The structure of claim 1, further comprising conductive bumps coupled to said terminal contact pad.

3. The structure of claim 1, wherein said substrate and said die have the same level.

4. The structure of claim 1, wherein said re-distribution layer comprises Ti/Cu/Au alloy or Ti/Cu/Ni/Au alloy.

5. The structure of claim 1, wherein the material of said substrate includes epoxy type FR5 or FR4.

6. The structure of claim 1, wherein the material of said substrate includes BT, silicon, PCB (print circuit board) material, glass or ceramic.

7. The structure of claim 1, wherein the material of said substrate includes alloy or metal.

8. The structure of claim 1, wherein said surrounding material includes a dielectric material.

9. The structure of claim 8, wherein said dielectric material includes an elastic dielectric material, a photosensitive material, a silicone dielectric based layer, siloxane polymer layer, polyimides (PI) layer or silicone resin layer.

10. The structure of claim 1, wherein said substrate and said contact conductive via have the same level.

* * * * *

UNITED STATES PATENT AND TRADEMARK OFFICE
CERTIFICATE OF CORRECTION

PATENT NO. : 7,884,461 B2  
APPLICATION NO. : 12/217086  
DATED : February 8, 2011  
INVENTOR(S) : Dyi-Chung Hu et al.

Page 1 of 1

It is certified that error appears in the above-identified patent and that said Letters Patent is hereby corrected as shown below:

On the title page the line beginning "(73) Assignee:" should read:  
--Advanced Chip Engineering Technology Inc.  
  Hukou Township Hsinchu County 303 (TW)--

Signed and Sealed this  
Nineteenth Day of August, 2014

Michelle K. Lee  
*Deputy Director of the United States Patent and Trademark Office*